United States Patent
Yoda

(10) Patent No.: US 9,460,829 B2
(45) Date of Patent: Oct. 4, 2016

(54) RESIN COMPOSITION, RESIN PELLET, METHOD FOR PRODUCING RESIN PELLET, AND SOLAR CELL ENCAPSULANT

(75) Inventor: Hiroaki Yoda, Chiba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 14/241,460

(22) PCT Filed: Aug. 22, 2012

(86) PCT No.: PCT/JP2012/071745
§ 371 (c)(1),
(2), (4) Date: Feb. 27, 2014

(87) PCT Pub. No.: WO2013/031788
PCT Pub. Date: Mar. 7, 2013

(65) Prior Publication Data
US 2014/0228499 A1    Aug. 14, 2014

(30) Foreign Application Priority Data
Sep. 1, 2011 (JP) ................................ 2011-190596

(51) Int. Cl.
| | |
|---|---|
| *H01B 3/44* | (2006.01) |
| *C08L 23/08* | (2006.01) |
| *H01L 31/048* | (2014.01) |
| *C04B 26/04* | (2006.01) |
| *C04B 26/06* | (2006.01) |
| *C08K 3/34* | (2006.01) |
| *C08K 9/08* | (2006.01) |

(52) U.S. Cl.
CPC ............. *H01B 3/448* (2013.01); *C04B 26/04* (2013.01); *C04B 26/06* (2013.01); *C08L 23/0869* (2013.01); *H01B 3/447* (2013.01); *H01L 31/0481* (2013.01); *C08K 3/34* (2013.01); *C08K 3/346* (2013.01); *C08K 9/08* (2013.01); *C08L 2203/204* (2013.01); *C08L 2203/206* (2013.01); *Y02E 10/50* (2013.01)

(58) Field of Classification Search
CPC ............. C08L 31/34; C08L 2203/206; C08L 2203/204; C08K 3/346; C08K 3/34
USPC .................. 524/445, 447, 563, 556
See application file for complete search history.

(56) References Cited

U.S. PATENT DOCUMENTS

| | | | | |
|---|---|---|---|---|
| 5,847,042 A * | 12/1998 | Hosoda | ................... | C08L 23/02 524/506 |
| 6,590,021 B2 * | 7/2003 | Mitsuno | .................... | C08J 5/18 524/447 |
| 7,417,085 B2 * | 8/2008 | Kimura | ......................... | 524/108 |
| 8,609,225 B2 * | 12/2013 | Inoue et al. | .................. | 428/141 |
| 2002/0065351 A1 | 5/2002 | Mitsuno et al. | | |
| 2008/0303005 A1* | 12/2008 | Whiteman | ........... | C08K 3/0008 252/587 |

FOREIGN PATENT DOCUMENTS

| | | | | |
|---|---|---|---|---|
| CN | 1346842 A | 5/2002 | | |
| JP | S59-124829 A | 7/1984 | | |
| JP | S 59232131 A | 12/1984 | | |
| JP | S62-212445 A | 9/1987 | | |
| JP | H01-288408 A | 11/1989 | | |
| JP | 2002-173560 A | 6/2002 | | |
| JP | 2002-173561 A | 6/2002 | | |
| JP | 2005-306959 A * | 11/2005 | ............. | C08L 31/02 |
| JP | 2006-036874 A | 2/2006 | | |
| WO | 2010/134451 A1 | 11/2010 | | |
| WO | WO 2010/134451 A1 * | 11/2010 | ............. | C03C 27/12 |

OTHER PUBLICATIONS

Int'l Search Report issued Nov. 13, 2012 in Int'l Application No. PCT/JP2012/071745.
Office Action issued May 4, 2015 in CN App No. 20128004167.X.
Office Action issued May 17, 2016 in JP Application No. 2012-183883.

* cited by examiner

*Primary Examiner* — Rip A Lee
(74) *Attorney, Agent, or Firm* — Panitch Schwarze Belisario & Nadel LLP

(57) ABSTRACT

A resin composition comprising an ethylene-unsaturated ester copolymer and metakaolin,
wherein the ethylene-unsaturated ester copolymer comprises structural units derived from ethylene and structural units derived from an unsaturated ester and the content of the structural units derived from the unsaturated ester is 20 to 35% by weight where the total content of the structural units derived from ethylene and the structural units derived from the unsaturated ester is taken as 100% by weight, and
the resin composition comprises 0.001 to 5 parts by weight of the metakaolin per 100 parts by weight of the ethylene-unsaturated ester copolymer.

4 Claims, No Drawings

US 9,460,829 B2

RESIN COMPOSITION, RESIN PELLET, METHOD FOR PRODUCING RESIN PELLET, AND SOLAR CELL ENCAPSULANT

CROSS-REFERENCE TO RELATED APPLICATION

This application is a Section 371 of International Application No. PCT/JP2012/071745, filed Aug. 22, 2012, which was published in the Japanese language on Mar. 7, 2013, under International Publication No. WO 2013/031788 A1, and the disclosure of which is incorporated herein by reference.

TECHNICAL FIELD

The present invention relates to a resin composition, a resin pellet and a production method thereof, and a solar cell encapsulant.

BACKGROUND ART

Resin pellets having adhesiveness have had a problem that the pellets adhere to each other during storing, transporting or molding the pellets. In order to solve this problem, it has been known a method of mixing a component for preventing adhesiveness into the resin. For example, patent document 1 discloses a method for mixing rubber pellets with higher fatty acids and/or salts thereof. Patent document 2 discloses a method for producing an ethylene-vinyl ester copolymer composition obtained by stirring the ethylene-vinyl ester copolymer and fillers such as organic powder, metal organic acid salt powder and inorganic powder with a mixer.
[Patent Document 1] JP 59-124829 A
[Patent Document 2] JP 2005-306959 A

DISCLOSURE OF THE INVENTION

However, the resin compositions disclosed in above-mentioned the patent documents do not have sufficient electric insulation compared with a resin that has been not mixed with a component for preventing adhesiveness.

The present invention is achieved to the problem and the object of the present invention is to provide a resin composition and resin pellets that are hard to adhere to each other and that are superior in electric insulation to a resin that has been not mixed with a component for preventing adhesiveness and a method for producing the resin pellet.

The inventor has completed the present invention as a result of considering in order to solve the problems.

The first of the present invention relates to a resin composition comprising an ethylene-unsaturated ester copolymer and metakaolin, wherein the ethylene-unsaturated ester copolymer comprises structural units derived from ethylene and structural units derived from an unsaturated ester and the content of the structural units derived from the unsaturated ester is 20 to 35% by weight where the total content of the structural units derived from ethylene and the structural units derived from the unsaturated ester is taken as 100% by weight, and the resin composition comprises 0.001 to 5 parts by weight of the metakaolin per 100 parts by weight of the ethylene-unsaturated ester copolymer.

The second of the present invention relates to a resin pellet in which metakaolin attaches to the surface of an ethylene-unsaturated ester copolymer pellet, wherein the ethylene-unsaturated ester copolymer that forms the ethylene-unsaturated ester copolymer pellet is an ethylene-unsaturated ester copolymer that comprises structural units derived from ethylene and structural units derived from an unsaturated ester wherein the content of the structural units derived from the unsaturated ester is 20 to 35% by weight where the total content of the structural units derived from ethylene and the structural units derived from the unsaturated ester is taken as 100% by weight, and the metakaolin attaches in an amount of 0.001 to 5 parts by weight per 100 parts by weight of the ethylene-unsaturated ester copolymer pellet.

The third of the present invention relates to a method for producing the above-described resin pellet, the method comprising attaching a dispersion liquid comprising metakaolin and a dispersion medium to the surface of the ethylene-unsaturated copolymer pellet, and removing the dispersion medium from the dispersion liquid attached to the surface of the ethylene-unsaturated ester copolymer pellet.

The fourth embodiment of the present invention relates to a solar cell encapsulant obtained using the above-described resin composition or the above-described resin pellet.

MODE FOR CARRYING OUT THE INVENTION

[Ethylene-Unsaturated Ester Copolymer]

The ethylene-unsaturated ester copolymer of the present invention is an ethylene-unsaturated ester copolymer that comprises structural units derived from ethylene and structural units derived from an unsaturated ester wherein the content of the structural units derived from the unsaturated ester is 20 to 35% by weight where the total content of the structural units derived from ethylene and the structural units derived from the unsaturated ester is taken as 100% by weight.

Examples of the unsaturated esters include carboxylic acid vinyl esters and unsaturated carboxylic acid alkyl esters. Examples of the carboxylic acid vinyl esters include vinyl acetate and vinyl propionate. Examples of the unsaturated carboxylic acid alkyl ester include methyl acrylate, ethyl acrylate, butyl acrylate, methyl methacrylate, ethyl methacrylate and glycidyl methacrylate.

Examples of the ethylene-unsaturated ester copolymer of the present invention include an ethylene-vinyl acetate copolymer, an ethylene-vinyl propionate copolymer, an ethylene-methyl acrylate copolymer, an ethylene-ethyl acrylate copolymer, an ethylene-butyl acrylate copolymer, an ethylene-methyl methacrylate copolymer, an ethylene-ethyl methacrylate copolymer, an ethylene-glycidyl methacrylate copolymer and an ethylene-vinyl acetate-methyl methacrylate copolymer.

From the viewpoint of improving processability and transparency, the content of the structural units derived from the unsaturated ester contained in the ethylene-unsaturated ester copolymer is preferably not less than 23% by weight and not more than 33% by weight, more preferably not less than 25% by weight and not more than 32% by weight. The total content of all the structural units derived from the unsaturated ester contained in the ethylene-unsaturated ester copolymer is the content of the structural unit derived from the unsaturated ester where the ethylene-unsaturated ester copolymer comprises structural units derived from two or more unsaturated esters.

The melt flow rate (MFR) of the ethylene-unsaturated ester copolymer is preferably not less than 4 g/10 minutes and not more than 50 g/10 minutes from the view point of improving processability. The upper limit of the MFR is more preferably 40 g/10 minutes. The lower limit of the MFR is more preferably 5 g/10 minutes. MFR is measured under conditions including temperature of 190° C. and a load of 21.18 N in accordance with JIS K7210-1995.

The molecular weight distribution (Mw/Mn) of the ethylene-unsaturated ester copolymer is preferably not less than 2 and not more than 8 from the viewpoint of improving processability. The lower limit of the molecular weight distribution is more preferably 2.5 and still more preferably 3. The upper limit of the molecular weight distribution is more preferably 5, still more preferably 4.5 and further preferably 4. Mw means a polystyrene equivalent weight average molecular weight and Mn means a polystyrene equivalent number average molecular weight.

The polyethylene equivalent weight average molecular weight of the ethylene-unsaturated ester copolymer is preferably 40000-80000 and more preferably 50000-70000. The polyethylene equivalent weight average molecular weight is the product of a polystyrene equivalent weight average molecular weight by a ratio of Q factor of polyethylene to Q factor of polystyrene (17.7/41.3) wherein the polystyrene equivalent weight average molecular weight is measured by Gel Permeation Chromatography.

Examples of methods for producing the ethylene-unsaturated ester copolymer include slurry polymerization method, solution polymerization method, bulk polymerization method and vapor phase polymerization method.

[Metakaolin]

The metakaolin of the present invention is calcined kaolinite about at 500° C. or more and crystal water in crystal thereof is removed. Examples of the commercial products include Insulite (Trade Mark) MC series (Manufactured by MIZUSAWA INDUSTRIAL CHEMICALS, CO., LTD).

The average particle diameter of the metakaolin of the present invention is not less than 0.1 μm and not more than 30 μm, and preferably not less than 1 μm and not more than 10 μm from the viewpoints of more uniformly dispersing the metakaolin in an ethylene-unsaturated ester copolymer in the case that the resin composition of the present invention is melt-kneaded and preventing mutual adhesiveness of pellets.

The average particle diameter is a median particle diameter of particle size distribution measured by volume basis from the diffraction (scattering) observed by irradiating a dispersion liquid in which metakaolin has been dispersed in ethanol with a laser beam.

The metakaolin obtained by grinding metakaolin with a mortar or a jet mill so that its average particle diameter can become not less than 0.1 μm and not more than 30 μm may be used.

[Resin Composition]

The resin composition of the present invention is a resin composition comprising the ethylene-unsaturated ester copolymer and 0.001 to 5 parts by weight of the metakaolin per 100 parts by weight of the ethylene-unsaturated ester copolymer.

The content of the metakaolin included in the resin composition of the present invention is preferably not less than 0.01 part by weight and not more than 1 part by weight, and more preferably not less than 0.1 part by weight and not more than 0.5 parts by weight from the viewpoint of preventing mutual adhesiveness of pellets more surely.

[Resin Pellet]

The resin pellet of the present invention is a resin pellet in which metakaolin attaches to the surface of the ethylene-unsaturated ester copolymer pellet.

The ethylene-unsaturated ester copolymer composed of the ethylene-unsaturated ester copolymer pellet is the above-mentioned ethylene-unsaturated ester copolymer. It is preferred that mutual adhesiveness of the resin pellets is restrained by attaching metakaolin to the ethylene-unsaturated ester copolymer pellets.

In the description, "ethylene-unsaturated ester copolymer pellet" means a pellet made of an ethylene-unsaturated ester copolymer and to which metakaolin is not attached and "resin pellet" means that a pellet in which metakaolin attaches to the surface of a pellet made of an ethylene-unsaturated ester copolymer.

Examples of the shape of the ethylene-unsaturated ester copolymer pellet include a sphere, an oval sphere, a cylinder, an oval cylinder, a dice and a rod. The size of the ethylene-unsaturated ester copolymer pellet is preferably not less than 3 mm and not more than 5 mm in diameter or length.

In the case that a solar cell encapsulant is produced using the resin pellet, 0.05 to 0.3 parts by weight of metakaolin preferably attaches to 100 parts by weight of the ethylene-unsaturated ester copolymer pellet.

The resin composition and the resin pellet of the present invention may include one or more compound selected from a group consisting of a weather stabilizer, a UV absorber and an antioxidant as necessary. The compound may attach to the surface of the ethylene-unsaturated ester copolymer pellet with the metakaolin.

Examples of the weather stabilizer include hindered amine based compounds. Examples of the UV absorbent include benzophenone based compounds. Examples of the antioxidant include phenol based compounds and phosphorus based compounds.

[Method for Producing Resin Pellet]

Examples of the method for producing the resin pellet include a method comprising applying a dispersion liquid comprising metakaolin and a dispersion medium to the surface of the ethylene-unsaturated ester copolymer pellet and removing the dispersion medium from the dispersion liquid attached to the surface of the ethylene-unsaturated ester copolymer pellet, and a method comprising applying metakaolin to the surface of the ethylene-unsaturated ester copolymer pellet without a dispersion medium.

Examples of the method comprising applying a dispersion liquid comprising metakaolin and a dispersion medium to the surface of the ethylene-unsaturated ester copolymer pellet and removing the dispersion medium from the dispersion liquid attached to the surface of the ethylene-unsaturated ester copolymer pellet include a method comprising covering the ethylene-unsaturated ester copolymer pellets with the dispersion liquid by spraying the dispersion liquid in a hopper to keep the ethylene-unsaturated ester copolymer pellets temporarily or an air feeding line to transport the pellets, drying them and removing the dispersion medium from the dispersion liquid attached to the surface of the ethylene-unsaturated ester copolymer pellets, which is described later.

The dispersion medium is preferably water. Examples of the method comprising dispersing the metakaolin in the dispersion medium include a method of a high-speed stirring method and a method using an ultrasonic wave.

Examples of the method comprising applying the metakaolin to the surface of the ethylene-unsaturated ester copolymer pellet without a dispersion medium include a method comprising mixing the metakaolin and the ethylene-unsaturated ester copolymer pellets with a mixer and a method comprising feeding the metakaolin into an air feeding line to transport the pellets, which is described later. Examples of the mixer include a tumble mixer and a Henschel mixer.

In the case that the resin pellets are produced on an industrial scale, it is necessary that the produced resin pellets are continuously and simply packed into a bag, a drum or a plastic container. Specifically, it is the following method comprising attaching the metakaolin to the ethylene-unsaturated ester copolymer pellets.

Examples of the above-mentioned method include:
a method comprising 1a) a step of producing an ethylene-unsaturated ester copolymer by extruding the ethylene-unsaturated ester copolymer as a strand from an extruder and cutting the strand into a pellet in water, 1b) a step of attaching a dispersion liquid comprising metakaolin and a dispersion medium in an air feeding line while the ethylene-unsaturated ester copolymer pellet is transported to the next step through the air feeding line, and 1c) a step of obtaining a resin pellet by drying the ethylene-unsaturated ester copolymer pellet in which the dispersion liquid is attached to the surface of the ethylene-unsaturated ester copolymer pellet and removing the water attached during the step 1a) and the dispersion medium attached during the step 1c), and a method comprising 2a) a step of producing an ethylene-unsaturated ester copolymer by extruding the ethylene-unsaturated ester copolymer as a strand from an extruder and cutting the strand into a pellet in water, 2b) a step of transporting the ethylene-unsaturated ester copolymer pellet to a hopper through an air feeding line, 2c) a step of attaching a dispersion liquid comprising metakaolin and a dispersion medium to the surface of the ethylene-unsaturated ester copolymer pellet in the hopper, 2d) a step of obtaining a resin pellet by drying the ethylene-unsaturated ester copolymer pellet in which the dispersion liquid is attached to the surface of the ethylene-unsaturated ester copolymer pellet and removing the water attached during the step 2a) and the dispersion medium attached during the step 2c).

The step 2d) may be carried out in the hopper in the step 2c).

A step b') of removing water attached to the ethylene-unsaturated ester copolymer pellet may be carried out between the step 1a) and the step 1b) or between the step 2a) and the step 2b).

Examples of the method comprising attaching the metakaolin to the surface of the ethylene-unsaturated ester copolymer pellet without a dispersion medium include a method comprising 3a) a step of producing an ethylene-unsaturated ester copolymer by extruding the ethylene-unsaturated ester copolymer as a strand from an extruder and cutting the strand into a pellet in water, 3b) a step of transporting the ethylene-unsaturated ester copolymer pellets to a hopper through an air feeding line 3c) a step removing attached water during the step 3a) in the hopper by drying and 3d) a step of attaching the metakaolin to the surface of the ethylene-unsaturated ester copolymer pellet in the air feeding line while the ethylene-unsaturated ester copolymer pellet is transported to the next step through an air feeding line.

A step b') of removing water attached to the ethylene-unsaturated ester copolymer pellet may be carried out between the step 3a) and the step 3b).

[Method for Calculating Content of Metakaolin]

It is possible to calculate the content of metakaolin contained in the resin composition of the present invention and the amount of metakaolin attached to the surface of the ethylene-unsaturated ester copolymer pellet of the present invention as ash content obtained by burning the resin composition or the resin pellet at 500° C. until its mass does not change.

[Solar Cell Encapsulant]

A resin product obtained by using the rein composition or the resin pellet of the present invention has higher volume resistivity than a resin product obtained by using a resin composition or a resin pellet that does not contain metakolin. Therefore, a sheet and so on produced by using the resin composition or the resin pellet of the present invention is suitable for a solar cell encapsulant that is used to encapsulate and protect a solar cell device, such as crystal, polycrystal, and amorphous.

Examples of methods for producing a sheet-like solar cell encapsulant include a method for molding the resin composition or the resin pellet with a flat die extruder, a calendar roller. When molding the resin composition or the resin pellet into a sheet, a coupling agent, an antifog agent, a plasticizer, a surfactant, a colorant, an anti-static agent, an antitamish agent, a flame retardant, a nucleating agent, a lubricant, and so on may be added.

A solar cell module in which a glass constituting a protect member is replaced with a film has been used with spreading thinner solar cell devices. It is desirable for a solar cell module in which a film constitutes an upper protect member that an encapsulant thereof has a lower water vapor transmission rate because moisture sinks into the module from the upper member side thereby corroding an electrode when it is exposed to an environment of rain or high humidity. The resin production obtained by using the resin composition or the resin pellet of the present invention also has a lower water vapor transmission rate than a resin production obtained by using a resin composition or a resin pellet that does not contain metakolin.

EXAMPLES

Hereinafter, the present invention will be described in detail with examples.

(Test Methods)

In Examples and Comparative Examples, measurements of pellets mutual adhesion test and properties were performed by the following methods.

[Pellets Mutual Adhesion Test]

Sample pellets (32 g) were put into a plastic bag with a zipper (60 mm×85 mm) and the zipper was closed. Subsequently, after applying a load of 900 g/cm$^2$ to the bag under 40° C. and keep it for 24 hours, the temperature was changed to 5° C., and then keep it for 24 hours. The load was removed and the bag was kept at 23° C. for 24 hours. Then, the bag was broken and the pellets were taken out. Non-adhesion of the pellets was observed and it was evaluated in accordance with the following standard:

○: Any pellet was not adhered, to each other.

X: Five or more pellets were adhered to each other.

[Volume resistivity (unit: Ω·cm)]

The pellets that was used for mutual adhesion test were pressed under 2 MPa for 5 minutes at 150° C. with a heat press mold, and cooled for 5 minutes at 5° C. with a cool press mold, thereby making a sheet whose thickness was about 500 μm. The sheet was placed on a large diameter electrode for plate sample (SME-8310, Manufactured by DKK-TOA CORPORATION), 500 V was applied to it for 1 minutes and the resistance thereof was measured with a digital insulation resistance tester (DSM-8103, Manufactured by DKK-TOA CORPORATION). The volume resistivity was calculated based on the resistance.

[Average Particle Diameter (Unit: μm)]

The average particle diameter of sample was measured by the following method. The sample was added to ethanol, and it was dispersed for 10 minutes with a homogenizer. A laser beam was applied to the dispersion liquid and the diffraction (scattering) was measured as particle size distribution based on volume basis with Microtrac Particle size Characterization (Manufactured by NIKKISO CO., LTD., MT-3000EX II) and a central particle diameter (median particle diameter) was obtained.

[Melt Flow Rate (MFR, unit: g/10 minutes)]

A melt flow rate of an ethylene-vinyl acetate copolymer was measured under the condition of the load of 21.18 N and at 190° C. in accordance with JIS K7210-1995.

[Amount of the Structural Unit Derived from Vinyl-Acetate (unit: % by weight)]

The amount of the structural unit derived from vinyl-acetate contained in an ethylene-vinyl acetate copolymer is a value where the total amount of the structural unit derived from ethylene and the structural unit derived from vinyl-acetate was taken as 100% by weight and was measured in accordance with JIS K7192.

[Molecular Weight Distribution (Mw/Mn)]

The polystyrene equivalent weight average molecular weight (Mw) and the polystyrene equivalent number average molecular weight (Mn) of the copolymer were measured by using the gel permeation chromatograph (GPC) method and the molecular weight distribution (Mw/Mn) was obtained.
(1) Apparatus: Waters 150C manufactured by Waters Corporation
(2) Separation column: TOSOH TSKgelGMH-HT
(3) Measuring temperature: 140° C.
(4) Carrier: ortho-dichlorobenzene
(5) Flow rate: 1.0 mL/min
(6) Injection amount: 500 μL
(7) Sample concentration: 5 mg/5 ml ortho-dichlorobenzene
(8) Detector: differential refractometry

[Water Vapor Transmission Rate]

The pellets that were used for mutual adhesion test were kneaded for 5 minutes with Laboplast mill. The kneaded material was pressed under 2 MPa for 5 minutes at 150° C. with a heat press mold, and cooled for 5 minutes at 30° C. with a cool press mold, thereby making a sheet whose thickness was about 500 μm. The water vapor transmission rate of the sheet was measured in accordance with JIS-K7129-2008 appendix A Humidity detection sensor method. It is preferred that the water vapor transmission rate of sheet is smaller.

Example 1

In an autoclave reactor, ethylene-vinyl acetate copolymer was synthesized using t-butyl peroxy-2-ethylhexanoate as an initiator under the condition of the reaction temperature of 188 to 195° C., the reaction pressure of 180 to 185 MPa and feed gas composition comprising ethylene of 63 to 68% by weight and vinyl-acetate of 37 to 32% by weight. The obtained ethylene-vinyl acetate copolymer was granulated using an extruder, thereby ethylene-vinyl acetate copolymer pellets were obtained. Into a bag made of polyethylene, 32 g of the ethylene-vinyl acetate copolymer pellets (amount of the structural unit derived from vinyl acetate of 32% by weight, MFR of 37 g/10 minutes, Molecular weight distribution of 3.8, hereinafter termed EVA-1) and 0.096 g of metakaolin (Insulite MC-6, Manufactured by MIZUSAWA INDUSTRIAL CHEMICALS, CO., LTD., average particle diameter of 6 μm) were put (metakaolin was 0.3 parts by weight per 100 parts by weight of EVA-1), and they were mixed, and then mutual adhesion test was performed. By using the resin pellets that had been used for mutual adhesion test, the volume resistivity was measured. The results were shown in Table 1.

Example 2

The same manner was performed as Example 1 exception for using 0.064 g of metakaolin (metakaolin was 0.2 parts by weight per 100 parts by weight of EVA-1). The results were shown in Table 1.

Example 3

The same manner was performed as Example 1 exception for changing the used resin to ethylene-vinyl acetate copolymer pellets (Manufactured by Sumitomo Chemical Co., Ltd., KA-40, amount of the structural unit derived from vinyl acetate of 28% by weight, MFR of 20 g/10 minutes, Molecular weight distribution of 4.0, hereinafter termed EVA-2) and using 0.032 g of metakaolin (metakaolin was 0.1 parts by weight per 100 parts by weight of EVA-2). The results were shown in Table 2.

Example 4

Into a bag made of polyethylene, 32 g of the ethylene-methyl methacrylate copolymer pellets (Manufactured by Sumitomo Chemical Co., Ltd., WK-402, amount of the structural unit derived from methyl methacrylate of 25% by weight, MFR of 20 g/10 minutes, hereinafter termed EMMA-1) and 0.064 g of metakaolin (Insulite MC-6, Manufactured by MIZUSAWA INDUSTRIAL CHEMICALS, CO., LTD., average particle diameter of 6 μm) were put (metakaolin was 0.2 parts by weight per 100 parts by weight of EMMA-1), and they were mixed, and then mutual adhesion test was performed. The mutual adhesion test was performed under the following conditions. A load of 900 g/cm$^2$ was applied to the bag under 40° C. and keep it for 48 hours, the temperature was changed to 5° C., and then keep it for 24 hours. The load was removed, the bag was broken and the pellets were taken out. Non-adhesion of the pellets was observed.

By using the resin pellets that had been used for mutual adhesion test, the volume resistivity was measured. The results were shown in Table 3.

Example 5

The same manner was performed as Example 4 exception for changing the used resin to ethylene-methyl acrylate copolymer pellets (Manufactured by Sumitomo Chemical Co., Ltd., CG4002, amount of the structural unit derived from methyl acrylate of 31% by weight, MFR of 5 g/10 minutes, Molecular weight distribution of 4.0, hereinafter termed EMA-1). The results were shown in Table 4.

Comparative Example 1

The same manner was performed as Example 1 exception for not using metakaolin. The results were shown in Table 1.

Comparative Example 2

The same manner was performed as Example 1 exception for using 0.20 parts by weight of kaolin (kaolin, Manufactured by Wako Pure Chemical Industries, Co., Ltd., average particle diameter of 5 μm, weight of 0.064 g) instead of metakaolin. The results were shown in Table 1.

Comparative Example 3

The same manner was performed as Example 3 exception for not using metakaolin. The results were shown in Table 2.

Comparative Example 4

The same manner was performed as Example 3 exception for using 0.10 parts by weight of Calcium stearate (AR-42, Manufactured by KYODO CHEMICAL CO., LTD., average particle diameter of 10 μm) instead of metakaolin. The results were shown in Table 2.

Comparative Example 5

The same manner was performed as Example 4 exception for not using metakaolin. The results were shown in Table 3.

Comparative Example 6

The same manner was performed as Example 5 exception for not using metakaolin. The results were shown in Table 4.

TABLE 1

|  |  | Example1 | Example2 | Comparative Example1 | Comparative Example2 |
|---|---|---|---|---|---|
| Ethylene-Vinyl Acetate Copolymer Pellet |  | EVA-1 | EVA-1 | EVA-1 | EVA-1 |
| Additive |  | metakaolin | metakaolin | none | kaolin |
| Addition Amount | parts by weight | 0.30 | 0.20 | — | 0.20 |
| Mutual Adhesion Test |  | ○ | ○ | X | ○ |
| Volume Resistivity | Ω · cm | 3.8E+15 | 2.2E+15 | 5.3E+14 | 4.5E+14 |
| Water vapor transmission rate | g/(m² · day) | 37 | 38 | 39 | — |

○: Any pellet was not adhered to each other.
X: Five or more pellets were adhered to each other.

TABLE 2

|  |  | Example3 | Comparative Example3 | Comparative Example4 |
|---|---|---|---|---|
| Ethylene-Vinyl Acetate Copolymer Pellet |  | EVA-2 | EVA-2 | EVA-2 |
| Additive |  | metakaolin | None | Calcium stearate |
| Addition Amount | parts by weight | 0.10 | — | 0.10 |
| Mutual Adhesion Test |  | ○ | X | ○ |
| Volume Resistivity | Ω · cm | 5.6E+15 | 2.1E+15 | 4.6E+14 |

TABLE 3

|  |  | Example4 | Comparative Example5 |
|---|---|---|---|
| Ethylene-Methyl methacrylate Copolymer Pellet |  | EMMA-1 | EMMA-1 |
| Additive |  | metakaolin | None |
| Addition Amount | parts by weight | 0.20 | — |
| Mutual Adhesion Test |  | ○ | X |
| Volume Resistivity | Ω · cm | 3.7E+16 | 1.1E+16 |

TABLE 4

|  |  | Example5 | Comparative Example6 |
|---|---|---|---|
| Ethylene-Methyl acrylate Copolymer Pellet |  | EMA-1 | EMA-1 |
| Additive |  | metakaolin | None |
| Addition Amount | parts by weight | 0.20 | — |
| Mutual Adhesion Test |  | ○ | X |
| Volume Resistivity | Ω · cm | 1.7E+15 | 8.4E+14 |

INDUSTRIAL APPLICABILITY

The present invention provides a resin composition and resin pellets that are hard to adhere to each other and that are superior in electric insulation to a resin that has been not mixed with a component for preventing adhesiveness and a method for producing the resin pellet.

The invention claimed is:

1. A solar cell encapsulant comprising a resin composition comprising an ethylene-unsaturated ester copolymer and metakaolin, wherein the ethylene-unsaturated ester copolymer comprises structural units derived from ethylene and structural units derived from an unsaturated ester, wherein a content of the structural units derived from the unsaturated ester is 20 to 35% by weight when a total content of the structural units derived from ethylene and the structural units derived from the unsaturated ester is taken as 100% by weight, and
wherein the resin composition comprises 0.001 to 5 parts by weight of the metakaolin per 100 parts by weight of the ethylene-unsaturated ester copolymer.

2. A solar cell module comprising the solar cell encapsulant according to claim 1.

3. A method for producing a resin pellet comprising metakaolin attached to a surface of an ethylene-unsaturated ester copolymer pellet, wherein the ethylene-unsaturated ester copolymer that forms the ethylene-unsaturated ester copolymer pellet comprises structural units derived from ethylene and structural units derived from an unsaturated ester, wherein a content of the structural units derived from the unsaturated ester is 20 to 35% by weight when a total content of the structural units derived from ethylene and the structural units derived from the unsaturated ester is taken as 100% by weight, and
wherein the metakaolin is attached in an amount of 0.001 to 5 parts by weight per 100 parts by weight of the ethylene-unsaturated ester copolymer pellet, the method comprising attaching a dispersion liquid comprising metakaolin and a dispersion medium to the surface of the ethylene-unsaturated copolymer pellet and removing the dispersion medium from the dispersion liquid attached to the surface of the ethylene-unsaturated ester copolymer pellet.

4. A solar cell encapsulant obtained from a resin pellet comprising metakaolin attached to a surface of an ethylene-unsaturated ester copolymer pellet, wherein the ethylene-unsaturated ester copolymer that forms the ethylene-unsaturated ester copolymer pellet comprises structural units derived from ethylene and structural units derived from an unsaturated ester, wherein a content of the structural units derived from the unsaturated ester is 20 to 35% by weight when a total content of the structural units derived from ethylene and the structural units derived from the unsaturated ester is taken as 100% by weight, and wherein the metakaolin is attached in an amount of 0.001 to 5 parts by weight per 100 parts by weight of the ethylene-unsaturated ester copolymer pellet.

* * * * *